(12) United States Patent
Kushwaha (10) Patent No.: US 9,646,015 B1
(45) Date of Patent: May 9, 2017

(54) DIGITAL WORK COMPRESSION

(71) Applicant: Amazon Technologies, Inc., Reno, NV (US)

(72) Inventor: Anubhav Kushwaha, Seattle, WA (US)

(73) Assignee: AMAZON TECHNOLOGIES, INC., Reno, NV (US)

(*) Notice: Subject to any disclaimer, the term of this patent is extended or adjusted under 35 U.S.C. 154(b) by 238 days.

(21) Appl. No.: 14/294,923

(22) Filed: Jun. 3, 2014

(51) Int. Cl.
*G06F 7/00* (2006.01)
*G06F 17/00* (2006.01)
*G06F 17/30* (2006.01)
*H04L 29/06* (2006.01)

(52) U.S. Cl.
CPC ........ *G06F 17/30153* (2013.01); *H04L 69/04* (2013.01)

(58) Field of Classification Search
CPC .............................................. G06F 17/30153
USPC .......................................................... 707/693
See application file for complete search history.

(56) References Cited

U.S. PATENT DOCUMENTS

| | | | | |
|---|---|---|---|---|
| 5,379,036 A | * | 1/1995 | Storer | H03M 7/3086 341/51 |
| 5,893,102 A | * | 4/1999 | Maimone | G06F 17/30595 |
| 2002/0108035 A1 | * | 8/2002 | Herley | H04K 1/00 713/165 |
| 2003/0021412 A1 | * | 1/2003 | Candelore | H04N 7/162 380/217 |
| 2006/0265436 A1 | * | 11/2006 | Edmond | G06F 17/30017 |
| 2008/0222734 A1 | * | 9/2008 | Redlich | G06F 21/577 726/26 |
| 2011/0145313 A1 | * | 6/2011 | Narayanan | H04L 69/04 709/203 |

OTHER PUBLICATIONS

Larsson, et al., "Offline Dictionary-Based Compression," Available at: http://www.larsson.dogma.net/doc99.pdf, 10 pages, (1999).
Sequitur algorithm—Wikipedia, the free encyclopedia, Available at: http://en.wikipedia.org/wiki/SEQUITUR_algorithm, 2 pages, (Printed Jun. 11, 2014).

* cited by examiner

*Primary Examiner* — Kimberly Wilson
(74) *Attorney, Agent, or Firm* — K & L Gates LLP (57) ABSTRACT

Various embodiments are directed to systems and methods for compressing digital works, such as books, magazines and similar works. Compressing a digital work may comprise finding an entry for a first string from the digital work in a compression dictionary and replacing a string value of the first string from the digital work with a first string reference associated with the first string at the entry for the first string. The compression dictionary may be generated, for example, from digital works associated with a user or user device that requested the digital work. Also, in some embodiments, the digital work itself may be used as a compression dictionary.

19 Claims, 9 Drawing Sheets

DIGITAL WORK COMPRESSION

BACKGROUND

Computing devices, such as tablet computers and e-readers are becoming increasingly popular for viewing textual digital works, such as electronic books and magazines, as well as other similar digital works. Using a computing device to view digital works has many advantages for the user. For example, the user is often able to store multiple digital works in a computing device. Instead of having to carry multiple printed books or magazines, the user need only carry a single computing device. Also, some computing devices provide advantageous features including, built-in reading lights, the ability to change the text size and/or font, etc.

Using computing devices to view digital works also presents challenges. For example, many digital works, such as books, magazines, etc. are protected by the copyright laws of various jurisdictions. To prevent copyright infringement, safeguards are used to limit the distribution of a digital work. Typically, copyright protection, often referred to as digital rights management or DRM, involves encrypting a digital work in a manner that prevents a user from distributing the digital work beyond the terms of the user's license. Data storage is also at a premium on many computing devices. Users want to store as many digital works as possible on their computing devices. To address this, digital works can be compressed prior to storage and decompressed when the users wants to view them. Encryption for DRM and compression for maximizing storage, however, are computationally expensive transactions. They either require faster, and more expensive, hardware or introduce undesirable delays into the user experience.

DETAILED DESCRIPTION

In the following description, reference is made to the accompanying drawings which illustrate several embodiments of the present invention. It is understood that other embodiments may be utilized and various operational changes may be made without departing from the spirit and scope of the present disclosure. The following detailed description is not to be taken in a limiting sense, and the scope of the embodiments of the present invention is defined only by the claims of the issued patent.

Figure 1:
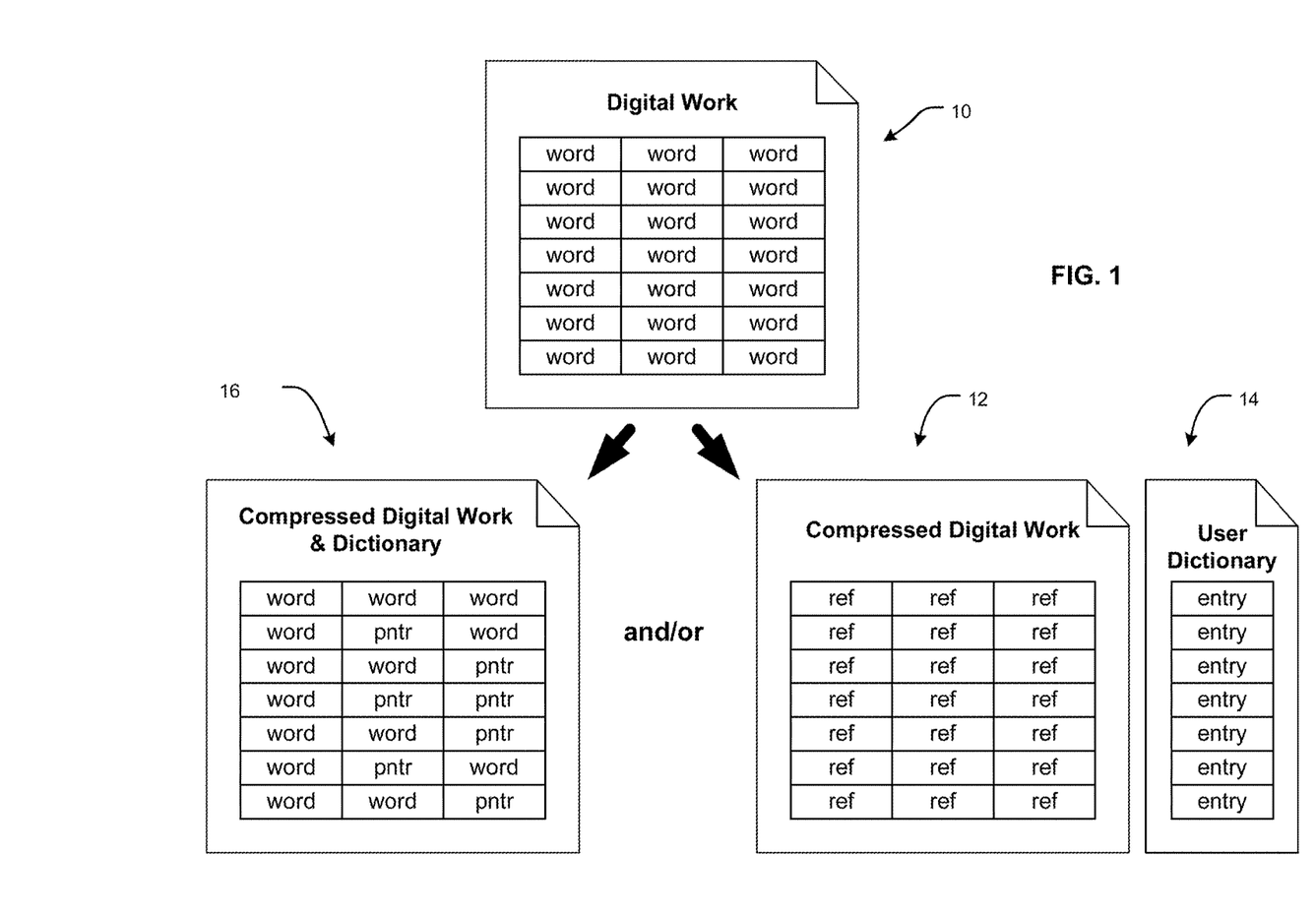
FIG. 1 is a diagram illustrating various embodiments for compressing a digital work comprising strings.

Systems and methods in accordance with the embodiments described herein may facilitate compression and/or encryption of digital works that is fast and requires reduced processing to implement. FIG. 1 is a diagram illustrating various embodiments for compressing a digital work 10 comprising strings. A string is a sequence of characters including, for example, alphanumeric characters, punctuation characters, formatting characters, etc. The example digital work 10 of FIG. 1 is a textual digital work, such as an electronic book or magazine. For example, the digital work 10 may comprise a series of words, where each word is considered a distinct string. Strings in a digital work, such as the words of the digital work 10, may be described by a string value and a string location. The string value indicates the sequence of characters making up the string. For example, when the string is a word, the string value indicates the letters making up the word. The string location describes the location of the string within the digital work. For example, when the digital work is a text and the string is a word, the string location of the word may indicate where the word appears in the text (e.g., an offset from the beginning of the text; a page number and an offset from the beginning of the page, a chapter number and an offset from the beginning of the chapter, etc.).

In various embodiments, the digital work 10 is compressed to generate a compressed digital work, such as the compressed digital work 12 or the compressed digital work 16. The compressed digital works 12, 16 represent versions of the digital work 10 resulting from compression. For example, the compressed digital works 12, 16 may have string locations corresponding to the string locations of the digital work 10. That is, each string location at the digital work 10 may have a corresponding string location at the compressed digital works 12, 16. Generating the compressed digital works 12, 16 may comprise replacing some or all of the string values from the digital work 10 with pointers and/or references to a compression dictionary, as described herein. Because the pointers and/or references may comprise less data than the string values that were replaced, the compressed digital works 12, 16 may require less storage than the digital work 10.

The replacing of some or all of the string values from the digital work 10 with pointers and/or references may be relative to the digital work 10. For example, replacing a string value with a pointer and/or reference may comprise over-writing a memory location of the digital work 10. In this case, the original digital work 10 does not exist after the compression is complete. In some embodiments, the computer system creates a complete copy of the digital work 10. Replacing a string value with a pointer and/or reference may comprise over-writing a memory location of the copy of the digital work 10. In this case, the copy of the digital work 10 becomes the compressed digital work 12 or 16 and the original digital work 10 remains. Also, in some embodiments, the computer system populates string locations of the compressed digital work 12 or 16 from the original digital work 10. Replacing a string value from the digital work 10 with a pointer and/or reference may then comprise writing the pointer and/or reference to a string location at the compressed digital work 12 or 16 that is equivalent to the string location of the replaced string value at the digital work 10.

According to some embodiments, a computing device compresses a digital work using the digital work 10 itself as a compression dictionary, resulting in the combined compressed digital work and dictionary 16. For example, many digital works include duplicate strings. Duplicate strings are strings that have the same string value, but appear at different string locations in the digital work. The computing device selects an occurrence of a first duplicate string in the digital work 10 as a reference string. In some embodiments, the reference string is the first occurrence of the duplicate string that is encountered in traversing the digital work from a beginning to an end of the digital work. The string location of the reference string is stored as a reference location. After selecting the reference string, the computing device may replace other occurrences of the duplicate string with pointers to the reference string location. Additional duplicate strings may be processed in the same way. The resulting compressed digital work 16 may comprise a set of unique reference strings and a set of pointers directed to one of the reference strings in the compressed digital work 16. In FIG. 1, reference strings are indicated as words while pointers are indicated by "pntr." Because the pointers generally require less storage space than the replaced strings, the compressed digital work may be smaller than the original digital work.

In some embodiments, the compressed digital work 16 may be at least partially encrypted before it is provided to a user. Encryption may occur according to any suitable encryption including, for example, a public key infrastructure (PKI) encryption as described herein. A user's computing device (e.g., a user device) may receive de-compress and, if needed, decrypt the digital work. To decompress the compressed digital work 16, the user device may replace each pointer with the string value of the reference string. In some embodiments, this is accomplished with a lookup operation that can be performed quickly without utilizing excessive processing resources.

According to some embodiments, the computing device may compress the digital work 10 using a separate compression dictionary 14. An example of an embodiment of this type is provided by compressed digital work 12 and compression dictionary 14. The compression dictionary 14 comprises entries where each entry indicates a string value and a string reference. The computing device creates the compressed digital work 12 by replacing the strings (e.g., words) from the digital work 10 with the string references of corresponding entries in the compression dictionary. In FIG. 1, the string references are indicated by "ref." If the computing device determines that a string in the digital work 10 does not have a corresponding entry in the compression dictionary 14, then it may generate a new entry for the string, including a new string reference. The string may then be replaced in the digital work 10 with the newly generated string reference. Upon completion of the compression, the compressed digital work 12 may be provided to the user device along with all or a portion of the compression dictionary 14. For example, in some embodiments, the user device may already store a copy of the compression dictionary. In such cases, the user may receive an update or patch to the compression dictionary instead of receiving the entire dictionary itself. For example, a compression dictionary patch may comprise less than all of the entries of the compression dictionary 14. Also, the compressed digital work 12 and/or the compression dictionary 14 or compression dictionary patch may be encrypted as described above.

In some embodiments, it may only be necessary to encrypt the compression dictionary or compression dictionary patch. For example, without the complete compression dictionary, it may not be practical to decompress the compressed digital work.

Figure 1A:
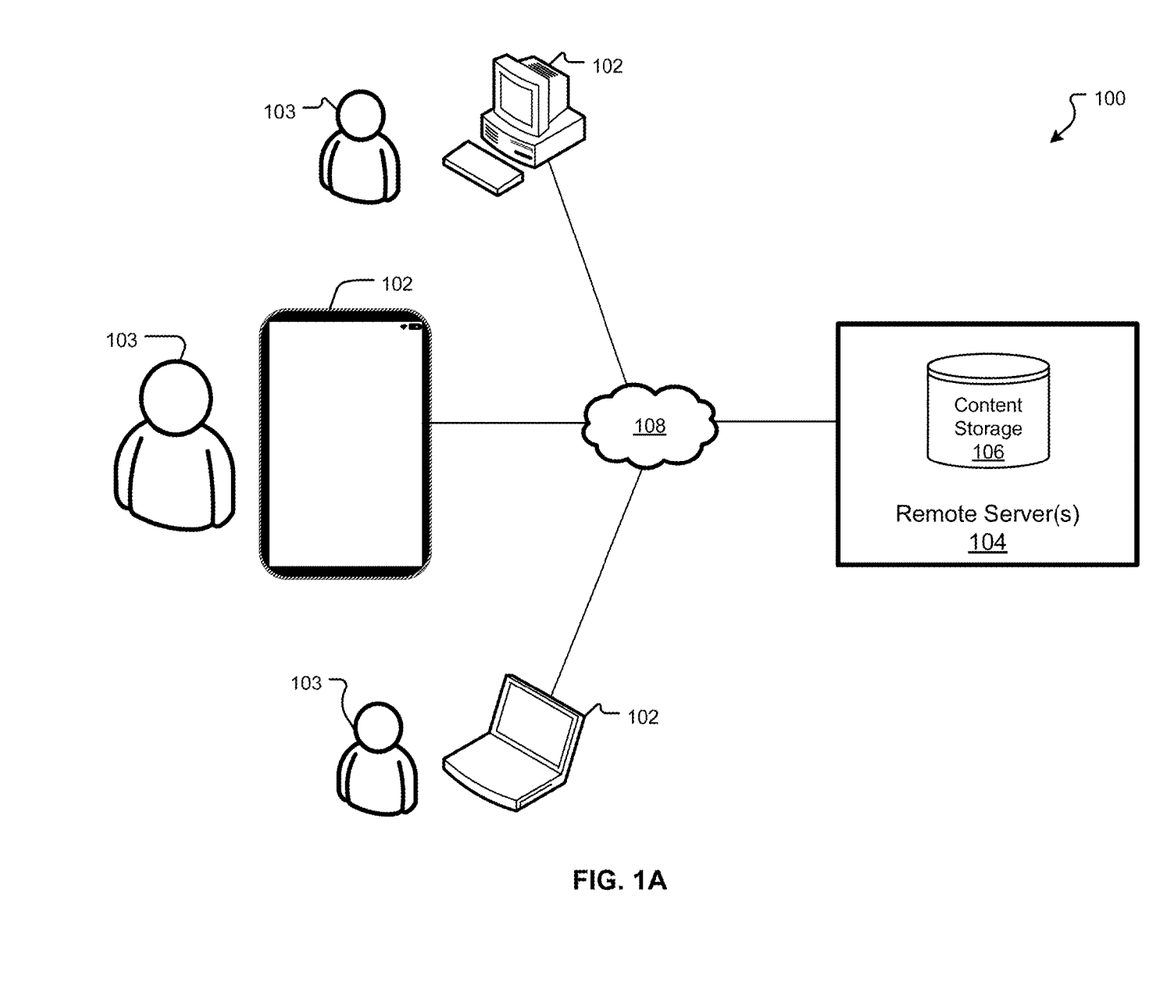
FIG. 1A is a diagram showing one embodiment of an environment for distributing digital works.

FIG. 1A is a diagram showing one embodiment of an environment 100 for distributing digital works. The environment 100 comprises user devices 102 and a remote service 104. The user devices 102 may receive various digital works and/or user interfaces from the remote service 104. User devices 102 may be any type of computing device that may be utilized by a user 103 to receive and/or view digital works. Examples of user devices 102 include electronic readers or e-readers, smart phones, tablet computers, laptop computers, desktop computers, personal data assistants, cellular phones, video gaming consoles or controllers, television set top boxes and portable media players, among others. Each user device 102 may be associated with one or more users 103. For example, a user 103 may own, lease, borrow or otherwise have rights to use his or her associated user device 102. The user 103 may purchase or otherwise acquire digital works from the remote service 104 for viewing with the user device 102. Any suitable remuneration arrangement may exist between the user 103 and the remote service 104. For example, the user 103 may have a subscription to the remote service 104 that entitles the user 103 to periodically receive digital works. In some embodiments, the user 103 purchases digital works from the service 104 a la carte. Also, in some embodiments, the user 103 receives digital works in return for viewing advertising provided through the remote service 104.

The remote service 104 may comprise one or more computing devices and associated storage for storing and distributing digital works. For example, the remote service 104 may comprise a single server and/or may comprise multiple servers (e.g., server computing devices). When multiple servers are used, the servers may be at a single geographic location or distributed over multiple geographic locations. For example, the remote service 104 may be implemented as a distributed or cloud service. The remote service 104 may comprise content storage 106 for storing digital works to be provided to user devices 102. The remote service 104 and user devices 102 may be in communication with one another via a network 108. The network 108 may comprise any suitable wired or wireless network components including, for example, a local area network (LAN), a wide area network (WAN), a cellular or other mobile data network, the Internet, etc.

Figure 2:
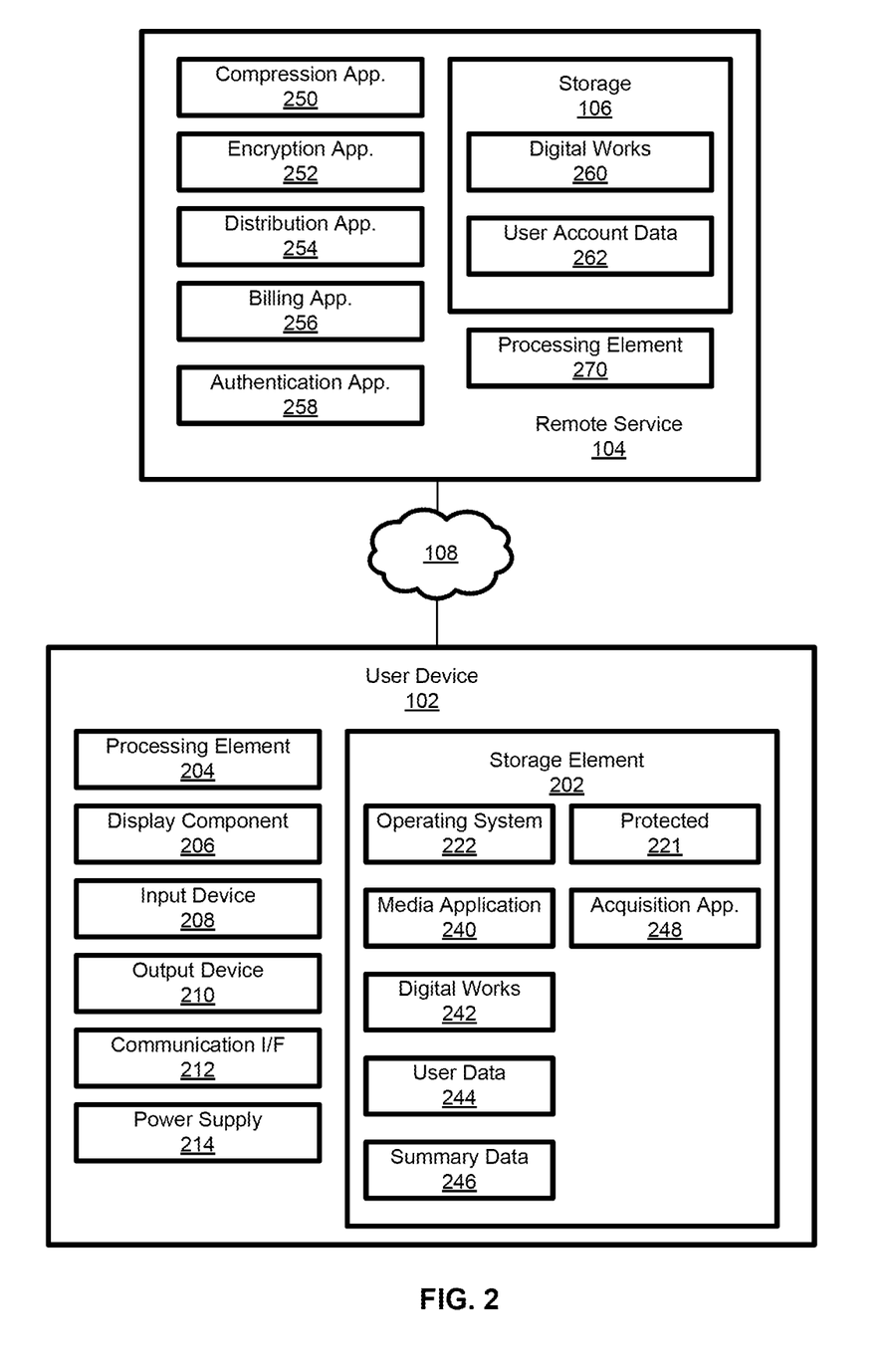
FIG. 2 is a block diagram showing additional details of one embodiment of a user device and remote service.

FIG. 2 is a block diagram showing additional details of an example user device 102 and remote service 104. The user device 102 may comprise, for example, a processor-based computing device. The user device 102 may include a display component 206. The display component 206 may comprise, for example, one or more devices such as cathode ray tubes (CRTs), liquid crystal display (LCD) screens, gas plasma-based flat panel displays, LCD projectors, or other types of display devices, etc. The user device 102 may also include one or more input devices 208 operable to receive inputs from a user. The input devices 208 can include, for example, a push button, touch pad, touch screen, wheel, joystick, keyboard, mouse, trackball, keypad, accelerometer, light gun, game controller, or any other such device or element whereby a user can provide inputs to the user device 102. These input devices 208 may be incorporated into the user device 102 or operably coupled to the user device 102 via wired or wireless interface. For computing devices with touch sensitive displays, the input devices 208 can include a touch sensor that operates in conjunction with the display component 206 to permit users to interact with the image displayed by the display component 206 using touch inputs (e.g., with a finger or stylus).

The user device 102 may also include at least one communication interface 212, comprising one or more wireless components operable to communicate with one or more separate devices within a communication range of the particular wireless protocol. The wireless protocol can be any appropriate protocol used to enable devices to communicate wirelessly, such as Bluetooth, cellular, IEEE 802.11, or infrared communications protocols, such as an IrDA-compliant protocol. It should be understood that the user device 102 may also include one or more wired communications interfaces for coupling and communicating with other devices. The user device 102 may also include a power supply 214, such as a wired alternating current (AC) converter, a rechargeable battery operable to be recharged through conventional plug-in approaches, or through other approaches such as capacitive charging.

The user device 102 also includes a processing element 204 for executing instructions and retrieving data stored in a storage element 202. The storage element 202 can include one or more different types of memory, data storage or computer readable storage media devoted to different purposes within the user device 102. For example, the storage element 202 may comprise flash memory, random access memory, disk-based storage, etc. Different portions of the storage element 202, for example, may be used for program instructions for execution by the processing element 204, storage of images or other digital works, and/or a removable storage for transferring data to other devices, etc.

The storage element 202 may store software for execution by the processing element 204, such as operating system 222 and media application 240. The media application 240 may be configured to playback the digital works 242, for example, via the display component 206 and/or output device 210 of the user device 102. In some embodiments, the media application 240 may also be configured to facilitate the acquisition of digital works 242 including, for example, requesting and receiving digital works 242, decompressing and/or decrypting the digital works 242, etc. Also, in some embodiments, an acquisition application 248 may facilitate the acquisition of digital works 242, for example, as described herein. The storage element 202 may also store data, such as files corresponding to one or more digital works 242, user data 244 relating to the user's consumption of those digital works 242 and other device metrics, and summary data 246 relating to the digital works 242, as will be described in greater detail below. In some embodiments, the storage element 202 may also comprise a protected memory space 221. The protected memory space 221 may be available, for example, only through the kernel of the operating system 222. In some embodiments, described herein, the protected memory space 221 may be used to store one or more compression dictionaries.

The remote service 104 may comprise a processing element 270 for executing various applications 250, 252, 254, 256, 258, etc. associated with the remote service 104. As described herein, the processing element 270 and various applications 250, 252, 254, 256, 258, may be located at a single server and/or may be distributed across multiple servers that may be at multiple locations. A distribution application 254 may interact with the user device 102 to provide the user device 102 with one or more digital works 260 stored at the remote service 104. For example, the distribution application 254 may receive a request for a digital work, prepare the digital work for transmission, verify and/or arrange for billing the user 103 of the user device 102, and transmit the digital work to the user device 102. The distribution process managed by the distribution application 254 may utilize various other applications of the remote service 104. For example, an authentication application 258 may interact with the user device 102 to authenticate the device 102 and/or the user 103 of device 102. A billing application 256 may interact with the user device 102 to facilitate payment by the user 103 for digital works. For example, when the user 103 purchases a digital work, the billing application 256 may receive and/or use stored credit card or other billing information from the user 103. Compression 250 and encryption 252 applications may compress and encrypt digital works before transmitting to the user device 102, as described herein. The content storage 106 of the remote service 104 may store digital works 260 for distribution, as well as user account data 262 describing users 103 and/or user devices 102 that may receive the digital works. User account data 262 may include information describing the user 103 and/or an account associated with the user 103 and/or the user device 102. User account data 262 may also comprise one or more compression dictionaries, as described herein.

Figure 3:
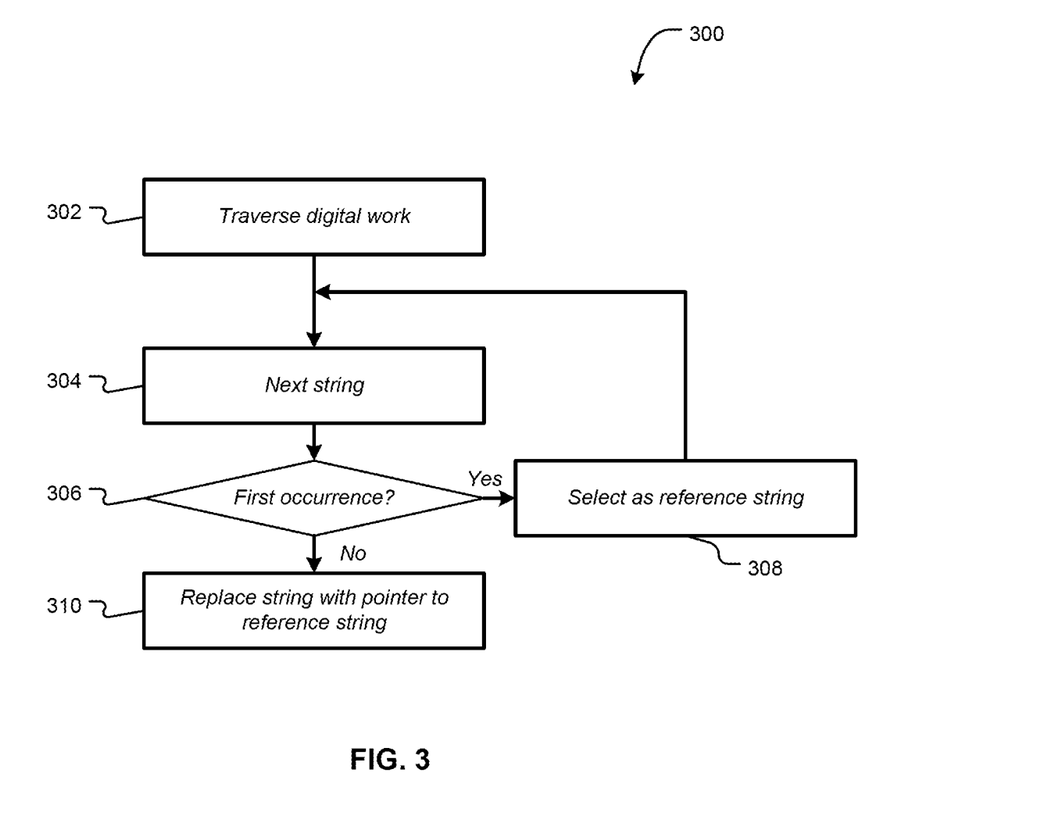
FIG. 3 is a flow chart showing one embodiment of a process flow for compressing a digital work using the digital work as a compression dictionary.

FIG. 3 is a flow chart showing one embodiment of a process flow 300 for compressing a digital work using the digital work itself as a compression dictionary. The process flow 300 may be executed by the remote service 104. For example, all or part of the process flow 300 may be executed by the compression application 250 of the remote service 104. At 302, the remote service 104 may begin traversing the digital work. Traversing the digital work may involve starting at a beginning of the digital work and considering each successive string in the digital work. The beginning of the digital work as well as the direction and order of traversal may be determined in any suitable manner. For example, the beginning of the work may be the beginning of a file containing all or part of the digital work. The order of traversal, then, may be based on the order of the bytes or other data units making up the digital work. When the digital work is a textual work or other digital work having a chronological order, the beginning of the work and the order of traversal may be based on the chronology of the digital work.

As described above, a string is a sequence of characters including, for example, alphanumeric characters, punctuation characters, formatting characters, etc. The digital work may be broken into strings in any suitable manner. For example, in some embodiments, each string may comprise a uniform number of characters (e.g., five characters). Accordingly, the remote service 104 may recognize a new string every five characters (or other suitable number).

In some embodiments, strings may be defined based on the language of the textual work with each word of the language may be considered a separate string. This may increase the achievable compression ratio as strings that correspond to words are more likely to be repeated in the digital work than strings defined in some other ways. The remote service 104 may identify strings that correspond to language words in any suitable manner. For example, the remote service 104 may delineate strings based on white space, punctuation characters, formatting characters, etc. Starting from the beginning of a string, the remote service 104 may consider each character to be part of the string until the application 250 encounters an end-of-string delimiter. When an end-of-string delimiter is encountered, the remote service 104 may consider the next character to be the beginning of a new string. An end-of-string delimiter may be any kind of character or characters that indicate the end of a string. Example end-of-string delimiters include, a space, a punctuation character, and/or a formatting character indicating the end of a word. In some embodiments, punctuation characters in a digital work may be represented a four-bit characters. In this way, the remote service 104 may determine that it has reached the end of a string when it encounters a four-bit character. Also, in some embodiments, not all punctuation characters may indicate the end of a string. For example, punctuation that may occur within a word (e.g., a hyphen, an apostrophe, etc.) may not indicate the end of a string. The remote service 104 may identify punctuation characters that do indicate the end of a string, for example, by identifying punctuation characters that are followed by a space. More accurate ways of delimiting words may lead to higher compression ratios. At the same time, some embodiments may achieve acceptable compression ratios with less accurate delimiting techniques.

While traversing the digital work, the remote service 104 may consider a next string at 304. When at the beginning of a digital work, the next string may be the first string. At 306, the remote service 104 may determine whether the considered string is the first occurrence of the string in the digital work, that is, whether any previously considered strings had the same string value as the considered string. If yes, then the remote service 104, at 308, may select the considered string as a reference string and store the string value and string location of the considered string. If no, then the remote service 104, at 310, may replace the string value of the considered string with a pointer to the reference location of a reference string in the digital work having the same string value. When the traversal is complete, the result may be a compressed digital work where each string location in the compressed digital work is either a reference string or a pointer to the reference location of a reference string. Replacing the string value of a considered string of the digital work may comprise over-writing the pointer to the string location at the original digital work, over-writing the pointer to a corresponding string location at a copy of the digital work, populating the pointer to a corresponding string location at a compressed digital work, etc.

Figure 3A:
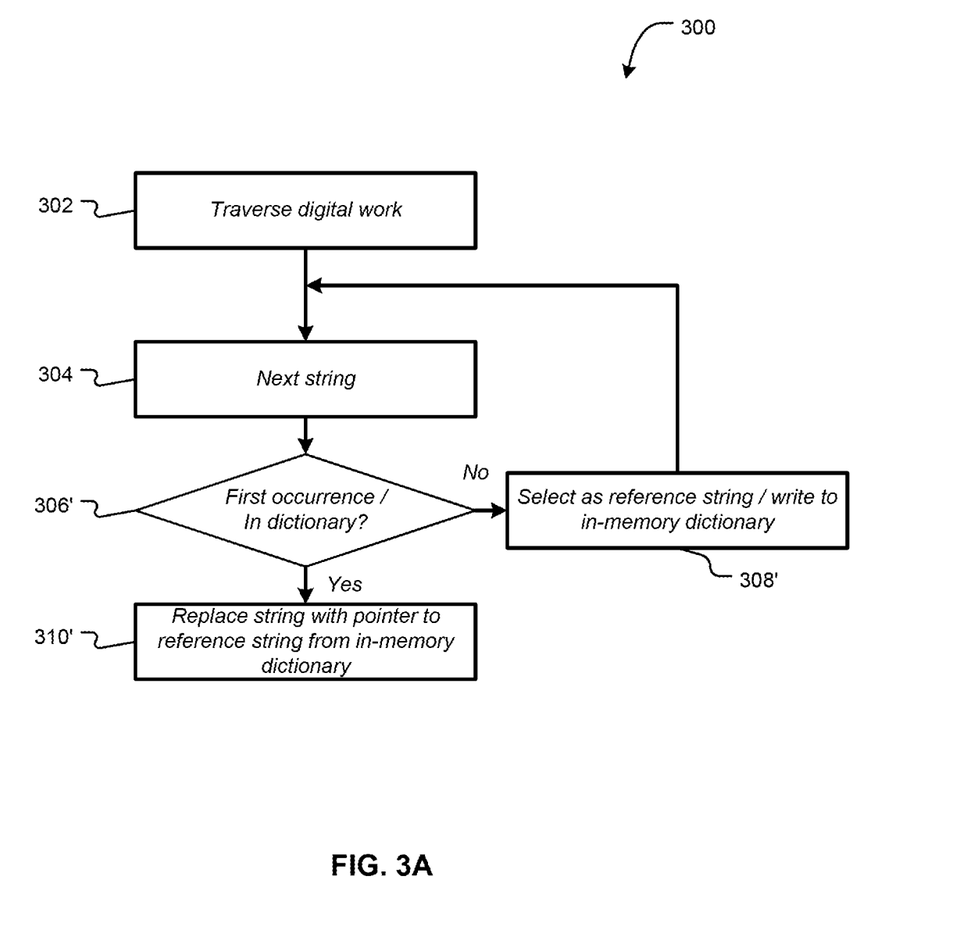
FIG. 3A is a flow chart showing another embodiment of the process flow of FIG. 3 illustrating the use of an in-memory dictionary at the remote service.

In some embodiments, the remote service 104 may utilize an in-memory dictionary during the compression process to track reference strings and their associated pointers. For example, FIG. 3A is a flow chart showing another embodiment of the process flow 300 of FIG. 3 illustrating the use of an in-memory dictionary at the remote service 104. The in-memory dictionary may be stored, for example, at a memory or other storage 106 of the remote service 104 and may take the form of a trie or other data structure. The in-memory dictionary may indicate string values and string locations for reference strings. For example, when a string is selected as a reference string at 308', the remote service 104 may write its string value and string location to the in-memory dictionary. At 306', the remote server 104 may determine whether a considered string is the first occurrence of that string in the digital work by comparing the string value of the considered string to the string values of the reference strings stored at the in-memory dictionary. If no match is found, then the considered string may be considered the first occurrence. If a match is found, then the considered string is not the first occurrence of the string in the digital work. In that case, at 310', the remote server 104 may retrieve a pointer the appropriate reference strong from the in-memory dictionary and replace the considered string with the pointer, as described above. When the compression is complete, the in-memory dictionary may be deleted. The use of an in-memory dictionary, as described and illustrated in FIG. 3A is just one way that the process flow 300 of FIG. 3 may be executed. Any other suitable technique may be used.

An example of compression as described with respect to the process flow 300 is provided by Tables 1 and 2 below. Table 1 shows an example textual selection with each cell of the table corresponding to an example string. Table 1 may represent the beginning of an example digital work and may, therefore, begin at page 1. The represented digital work may begin at the top left and proceed from left to right and from up to down, similar to English language text. It will be appreciated that texts in other languages may be traversed in other directions. For example, a text in Arabic or Hebrew may begin at the top right and proceed from right to left and from up to down.

TABLE 1

| Page 1 | | | | |
| --- | --- | --- | --- | --- |
| This | is | a | demonstration | paragraph |
| to | demonstrate | how | a | paragraph |
| may | be | compressed | using | the |
| compression | process | flow | 300 | . |
| The | process | flow | 300 | may |
| be | used | to | reduce | the |
| size | of | the | digital | work |
| including | this | paragraph | . | |

After compression according to the process flow 300, the example text from Table 1 may be represented as indicated in Table 2 below:

TABLE 2

| Page 1 | | | | |
| --- | --- | --- | --- | --- |
| This | is | a | demonstration | paragraph |
| to | demonstrate | how | P1, 3 | P1, 5 |
| may | be | compressed | using | the |
| compression | process | flow | 300 | . |
| The | P1, 22 | P1, 23 | P1, 24 | may |
| P1, 12 | used | to | reduce | P1, 15 |
| size | of | P1, 14 | digital | work |
| including | this | P1, 5 | P1, 20 | |

According to Table 2, the reference location of each reference string is pointed to by an indication of the page of the reference string (page 1 for all reference strings in the example) and position. It will be appreciated, however, that the reference locations may be indicated in any suitable way including, for example, as an absolute position of the string in the digital work. Also, in some embodiments, the strings of a digital work may be organized according to one or more grids, where each cell in the grid has a row indicator and a column indicator. In various embodiments, the pointer to the reference location may be smaller than most words that are replaced. For example, in some embodiments, each character of the digital work is expressed by two (2) bytes. A pointer to a reference location may also be expressed by two bytes (e.g., one byte representing the page and another byte representing the location). Accordingly, each string, other than the reference string, may be represented at a size roughly equivalent to one uncompressed letter character. In some embodiments, the size of the digital work may affect the size of the pointer to the reference location. Also, the type of textual encoding used in the digital work may affect the original size of each letter character. Both factors may ultimately affect the compression factor for each string. The compression factor for an entire digital work may also depend on the number of duplicate strings in the work.

Further, referring to Table 2, each punctuation mark character that is not within another word or string is considered to be its own string. The compression may be performed in this manner. Alternatively, punctuation mark character or characters may be left as is, considered to be part of the preceding string, or treated in any other suitable manner. Although reference strings in the process flow 300 are selected in order of appearance in the digital work, it will be appreciated that any other suitable mechanism may be used to select reference strings. Also, in Tables 1 and 2, each word having different capitalization is considered to be a separate string. Some embodiments may operate this way. Also, some embodiments may consider equivalent words with different capitalizations to be equivalent strings. For example, pointers to reference locations in the compressed digital work may include a capitalization bit or bits indicating whether the letters of the word are capitalized.

Figure 4:
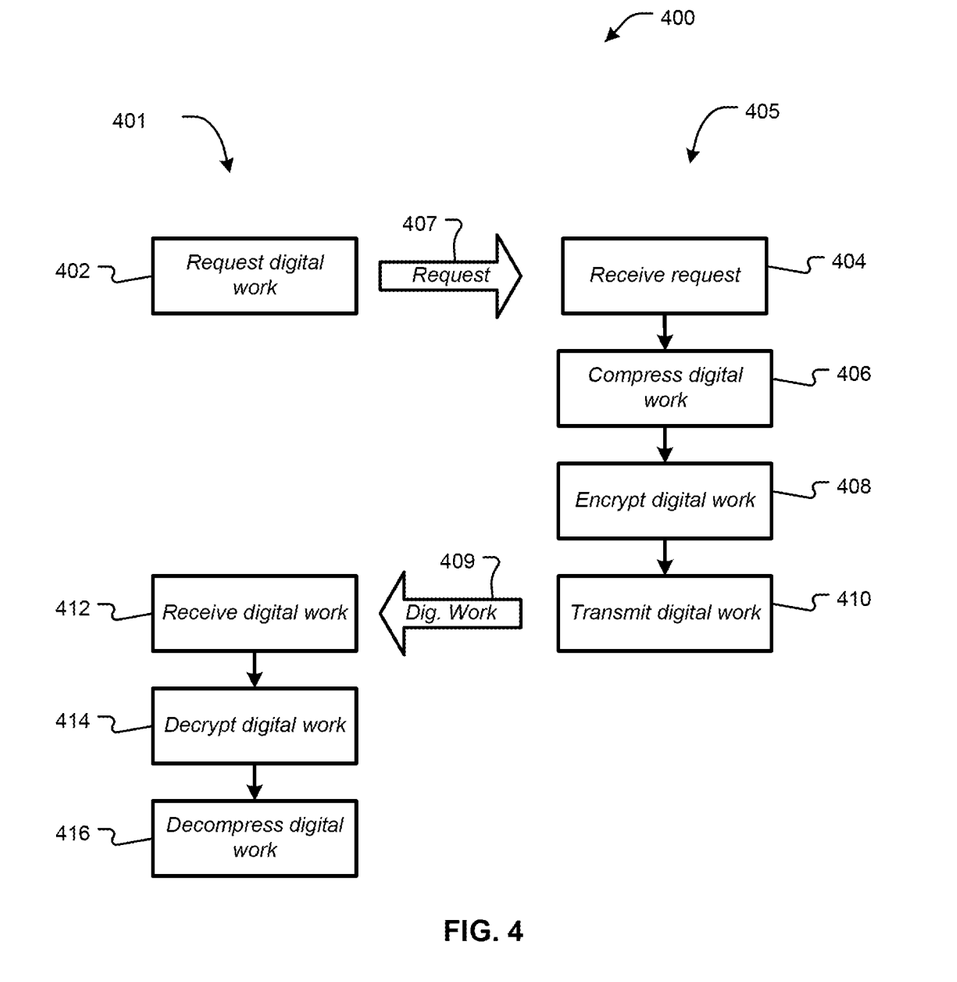
FIG. 4 is a flow chart showing one embodiment of a process flow for distributing a digital work that includes compressing the digital work using the digital work as a compression dictionary.

FIG. 4 is a flow chart showing one embodiment of a process flow 400 for distributing a digital work that includes compressing the digital work using the digital work itself as a compression dictionary, for example, as described with respect to FIG. 3. The process flow 400 comprises actions that may be performed by the user device 102 (e.g., under the direction of a user 103) and/or the remote service 104. For example, column 401 includes actions that may be performed by a user device 102 and column 405 includes actions that may be performed by the remote service 104. At 402, the user device 102 may request a digital work. The request 407 may be made, for example, by the acquisition application 248. The request 407 may comprise an indication of the requested digital work.

In some embodiments that utilize public key infrastructure or PKI for encrypting the digital work, the request 407 may contain a public key for the user device 102. The public key may be part of a public key/private key pair associated with the user device 102, the user 103 and/or the acquisition application 248. In some embodiments, the user device 102 may generate the public/private key pair prior to sending the request 407. For example, the user device 102 may generate the public and private keys based on reference data. The reference data may be any suitable data from which the keys may be derived. Example reference data may include an indication of the user device 102 (e.g., a universally unique identifier or UUID), an indication of the user 103, such as a user name, given name, or e-mail address, and input provided by the user 103. For example, the user device 102 may prompt the user 103 to enter a pattern through an input device 208, such as a mouse or touch screen. The coordinates of the movements and/or pressure received through the input device 208 may be utilized to generate the public/private keys. Any suitable algorithm may be used to generate the keys including, for example, an RSA algorithm, a Diffie Hellman scheme, etc. The user device 102 may utilize a single public/private key pair for transactions with the remote service 104 and/or may generate a new public/private key pair after a predetermined number of transactions with the remote service 104. In some embodiments, the user device 102 generates a new private/public key pair after every transaction with the remote service 104.

At 404, the remote service 104 may receive the request 407. At 406, the remote service 104 may compress the requested digital work, for example, as described above with respect to the process flow 300. For example, the compression may be performed by the compression application 250.

At 408, the remote service 104 may encrypt the digital work, for example, utilizing the encryption application 252. In embodiments utilizing PKI encryption, the digital work may be encrypted utilizing the public key received from the user device 102. Some embodiments may utilize symmetric encryption in addition to, or instead of, PKI. According to a symmetric encryption, both the user device 102 and the remote service 104 have a copy of the same symmetric key, which is kept secret. The remote service 104 may encrypt the digital work utilizing the symmetric key. The symmetric key may be generated using any suitable technology including, for example, the Advanced Encryption Standard (AES). Some embodiments may utilize PKI and symmetric encryption together. For example, the remote service 104 may encrypt the symmetric key utilizing the public key of the user device 102. The user device 102 may utilize its private key to decrypt the symmetric key, which is, in turn, used to decrypt the digital work.

In various embodiments, the remote service 104 may encrypt less than all of the digital work. When the digital work is used as a compression dictionary, it may only be necessary to encrypt portions of the digital work that include reference strings. For example, when the first occurrence of a string in the digital work is selected as the reference for that string, all or a significant portion of the reference strings for the compressed digital work may occur near the beginning of the work. Accordingly, the remote service 104 may only need to encrypt a portion of the digital work starting from the beginning. The portion of the digital work to be encrypted may be selected in any suitable manner. For example, the remote service 104 may encrypt a predetermined fraction of the total digital work (e.g., the first 25%, the first 30%, the first 50%, etc.). In some embodiments, the remote service 104 (e.g., the encryption application 252) may analyze the compressed digital work to determine how much of the work should be encrypted. For example, the remote service 104 may encrypt a portion of the digital work sufficient to cover a predetermined fraction of the reference strings (e.g., 75%, 90%, 99%, etc.). In some embodiments, different types of thresholds may be used in conjunction. For example, the remote service 104 may encrypt a threshold percentage of the total work, or a threshold percentage of the reference strings depending, for example, on which threshold requires encrypting less of the overall digital work.

At 410, the remote service 104 may transmit the digital work 409 to the user device 102, which may receive the digital work 409 at 412. At 414, the digital work 409 may be decrypted, for example, by the acquisition application 248. Decrypting the digital work 409 may involve applying an encryption key to derive a clear version of the digital work 409. In embodiments where the digital work 409 is encrypted utilizing a PKI encryption method, the user device 102 may apply its own private key to perform the decryption. In embodiments where the digital work 409 is encrypted utilizing a symmetric encryption, the user device 102 may apply a symmetric key. At 416, the user device 102 may decompress the digital work 409. Decompressing the digital work 409 may involve traversing the work and replacing each pointer to a reference string with the value of the indicated reference string.

Figure 5:
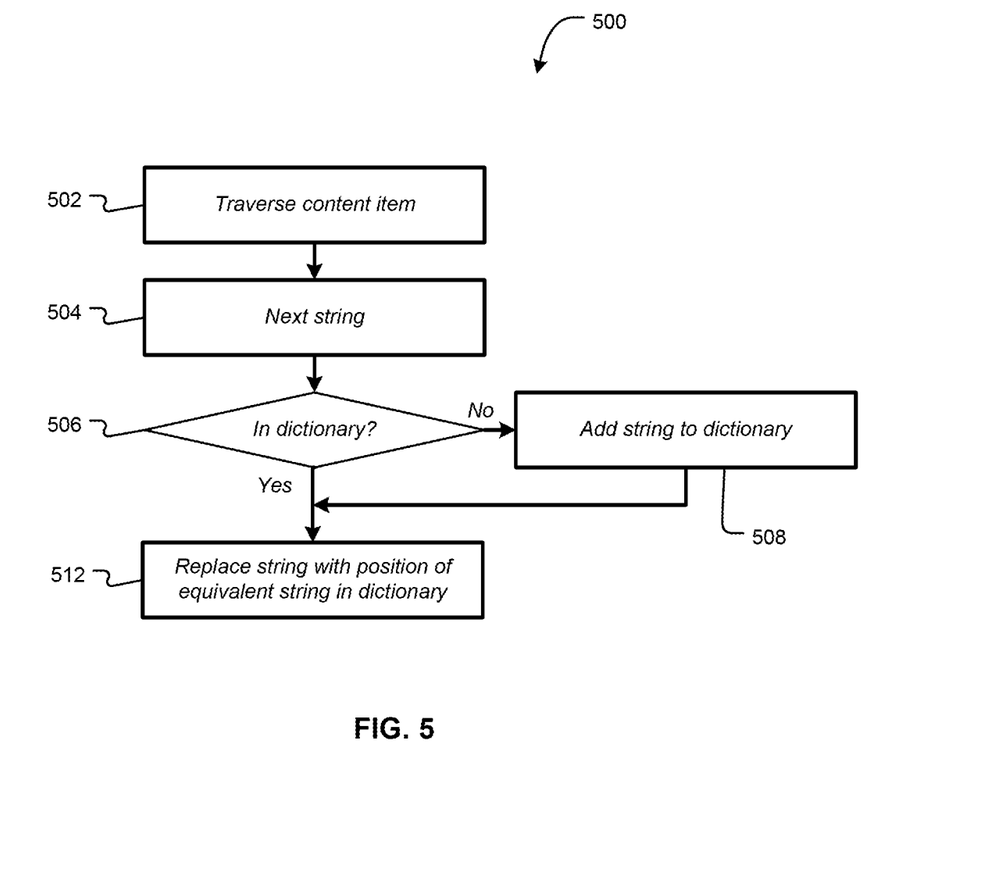
FIG. 5 is a flow chart showing one embodiment of a process flow for compressing a digital work using a separate compression dictionary.

FIG. 5 is a flow chart showing one embodiment of a process flow 500 for compressing a digital work using a separate compression dictionary. The process flow 500 may be executed by the remote service 104. For example, all or part of the process flow 500 may be executed by the compression application 250 of the remote service 104. To execute the process flow 500, the remote service 104 may utilize a separate compression dictionary. The compression dictionary may comprise a plurality of entries, where each entry indicates a string value and a string reference. In some embodiments, the strings indicated in the compression dictionary may be strings pulled from previous digital works requested by the same user 103. For example, each user 103 and/or user device 102 may have an associated compression dictionary. Copies of each user's compression dictionary may be stored at the remote service 104, for example as user account data 262, and at the local user devices 102, for example, at protected memory space 221 and/or another location of the storage element 202. The compression dictionary for a given user 103 or device 102 may be generated as the remote service 104 compresses digital works requested by the user 103 or device 102.

At 502, the remote service 104 may traverse the digital work, for example, as described herein with respect to 302. At 504, the remote service 104 may consider a next string. If the considered string has an entry in the compression dictionary at 506, the remote service 104 may replace a string value of the considered string with a string reference from the entry. A string may have an entry in the compression dictionary when the compression dictionary comprises an entry having a string value equivalent to the string value of the considered string. Replacing a string value of a considered string of the digital work may comprise over-writing the string reference to the string location at the original digital work, over-writing the string reference to a corresponding string location at a copy of the digital work, populating the string reference to a corresponding string location at a compressed digital work, etc.

If the considered string does not have an entry in the compression dictionary, then the remote service 104 may create an entry for the considered string in the compression dictionary at 508 and then replace the string value with the reference to the entry at 512, for example, as described above. This process flow 500 may be repeated for all strings in the digital work, resulting in a compressed digital work. In embodiments where the digital work includes at least one string that did not have a previous entry in the compression dictionary, the results of the process flow 500 may also include a new compression dictionary and/or an update or patch to the previous compression dictionary. The process flow 500 may be utilized in embodiments where there is no pre-existing compression dictionary. For example, the remote service 104 may create a compression dictionary. When considering the first occurrence of each unique string in the digital work, the remote service 104 may determine at 506 that the considered string does not have a corresponding entry in the compression dictionary, and may add one at 508. When subsequent occurrences of the string are considered later in digital work, then the remote service 104 may find the previously generated entry at 506, and proceed to 512 as described above. When there is no pre-existing compression dictionary, the remote service 104 may provide the entirety of the newly generated compression dictionary to the user device 102.

The example paragraph of Table 1 may be compressed in the manner described by the process flow 500, for example, as shown in Table 3 below, with the compression dictionary represented by Table 4:

TABLE 3

| Page 1 | | | | |
|---|---|---|---|---|
| 24 | 12 | 22 | 3 | 33 |
| 32 | 16 | 23 | 22 | 33 |

TABLE 3-continued

| Page 1 | | | | |
|---|---|---|---|---|
| 25 | 5 | 13 | 36 | 35 |
| 8 | 18 | 28 | 38 | 40 |
| 1 | 18 | 28 | 38 | 25 |
| 5 | 11 | 32 | 26 | 35 |
| 6 | 39 | 35 | 14 | 15 |
| 10 | 20 | 33 | 40 | |

TABLE 4

| | | | | | | | |
|---|---|---|---|---|---|---|---|
| 1 | The | 11 | used | 21 | comprise | 31 | sequence |
| 2 | a | 12 | is | 22 | a | 32 | to |
| 3 | demonstration | 13 | compressed | 23 | how | 33 | paragraph |
| 4 | description | 14 | digital | 24 | This | 34 | traverse |
| 5 | be | 15 | work | 25 | may | 35 | the |
| 6 | size | 16 | demonstrate | 26 | reduce | 36 | using |
| 7 | understood | 17 | departing | 27 | set | 37 | pointer |
| 8 | compression | 18 | process | 28 | flow | 38 | 300 |
| 9 | changes | 19 | string | 29 | according | 39 | of |
| 10 | including | 20 | this | 30 | different | 40 | . |

Figure 6:
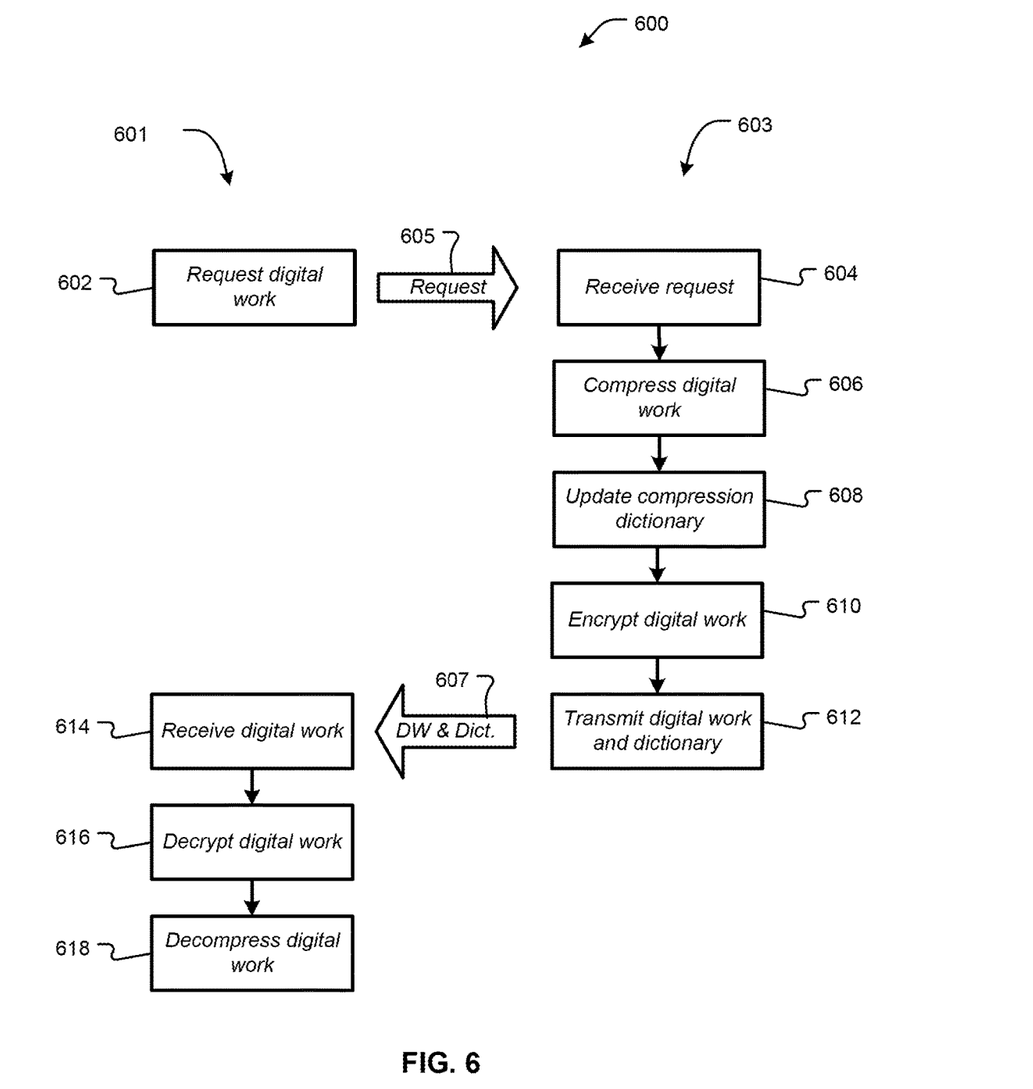
FIG. 6 is a flow chart showing one embodiment of a process flow for distributing a digital work that includes compression utilizing a separate compression dictionary.

FIG. 6 is a flow chart showing one embodiment of a process flow for distributing a digital work that includes compression utilizing a separate compression dictionary, for example, as described with respect to the process flow 500. The process flow 600 comprises actions that may be performed by the user device 102 (e.g., under the direction of a user 103) and/or the remote service 104. For example, column 601 includes actions that may be performed by a user device 102 and column 603 includes actions that may be performed by the remote service 104. At 602, the user device 102 may request a digital work. The request 605 may be made, for example, by the acquisition application 248. The request 605 may comprise an indication of the requested digital work. In some embodiments, the request 605 may also comprise a public key of the user 103 and/or user device 102, for example, as described herein with respect to request 407. At 604, the remote service 104 may receive the request 605. The remote service 104 may compress the digital work at 606, for example, as described herein above with respect to the process flow 600. The compression dictionary used for the compression may be selected and/or generated in any suitable manner. In some embodiments, the compression dictionary may be specific to the user device 102 and/or user 103 requesting the digital work. For example, when a user 103 and/or user device 102 makes a first request for a digital work, the remote service 104 may generate a new compression dictionary, as described above. When the user 103 and/or user device 102 requests subsequent digital works, the remote service 104 may use the previously created compression dictionary. Accordingly, the entries in the compression dictionary may indicate string values from digital works associated with the user 103 and/or user device 102, for example, other digital works that the user 103 and/or user device 102 has requested from the remote service 104.

At 608, the remote service 104 may update the compression dictionary also, for example, as described above with respect to the process flow 600. In embodiments or instances that do not use a pre-existing compression dictionary, this may involve creating a new compression dictionary, as described herein. In embodiments or instances that do use a pre-existing compression dictionary, this may involve adding entries to the compression dictionary for strings in the digital work that did not have previous entries. In some cases, all of the strings in a digital work may have pre-existing entries in the compression dictionary. Accordingly, no updating of the compression dictionary may be required.

At 610, the remote service 104 may encrypt the digital work, the compression dictionary (either a complete version of the compression dictionary or a patch, as described herein). In some embodiments, the remote service 104 may encrypt only the compression dictionary. For example, without the compression dictionary, it may be difficult to decompress and view the digital work. Encryption may be performed utilizing any suitable symmetric or PKI encryption, as described herein with respect to the process flow 400. At 612, the remote service 104 may transmit to the user device 102 a package 607 including the digital work and a copy of the compression dictionary. Although a single package 607 is shown in FIG. 6, in some embodiments the remote service 104 may transmit the digital work and compression dictionary separately.

At 614, the user device 102 may receive the digital work and compression dictionary 607. At 616, the user device 102 (e.g., the acquisition application 248) may decrypt the digital work and/or compression dictionary 607. In embodiments utilizing PKI encryption, for example, the user device 102 may apply a private key associated with the user 103 and/or the user device 102. At 618, the user device 102 (e.g., the acquisition application 248) may decompress the digital work. For example, the user device 102 may traverse the digital work, replacing each reference to the compression dictionary with a string value indicated at the corresponding compression dictionary entry.

FIG. 6 illustrates an embodiment where the remote service 104 provides the user device 102 with a complete copy of the compression dictionary. In some embodiments, instead of providing the entire compression dictionary, the remote service 104 may provide the user device 102 with an update or patch to the compression dictionary. For example, when the compression dictionary is created from digital works requested by the same user 103, the user device 102 may have a previous version of the compression dictionary stored locally. Instead of providing the entire compression dictionary along with the digital work, then, the remote service 104 may instead provide the digital work along with a compression dictionary patch. The compression dictionary patch may show changes relative to the previous version of the compression dictionary (e.g., newly generated entries). The newly generated entries, for example, may indicate strings that are in the currently requested digital work, but not in the previous digital works used to generate previous version of the compression dictionary.

Figure 6A:
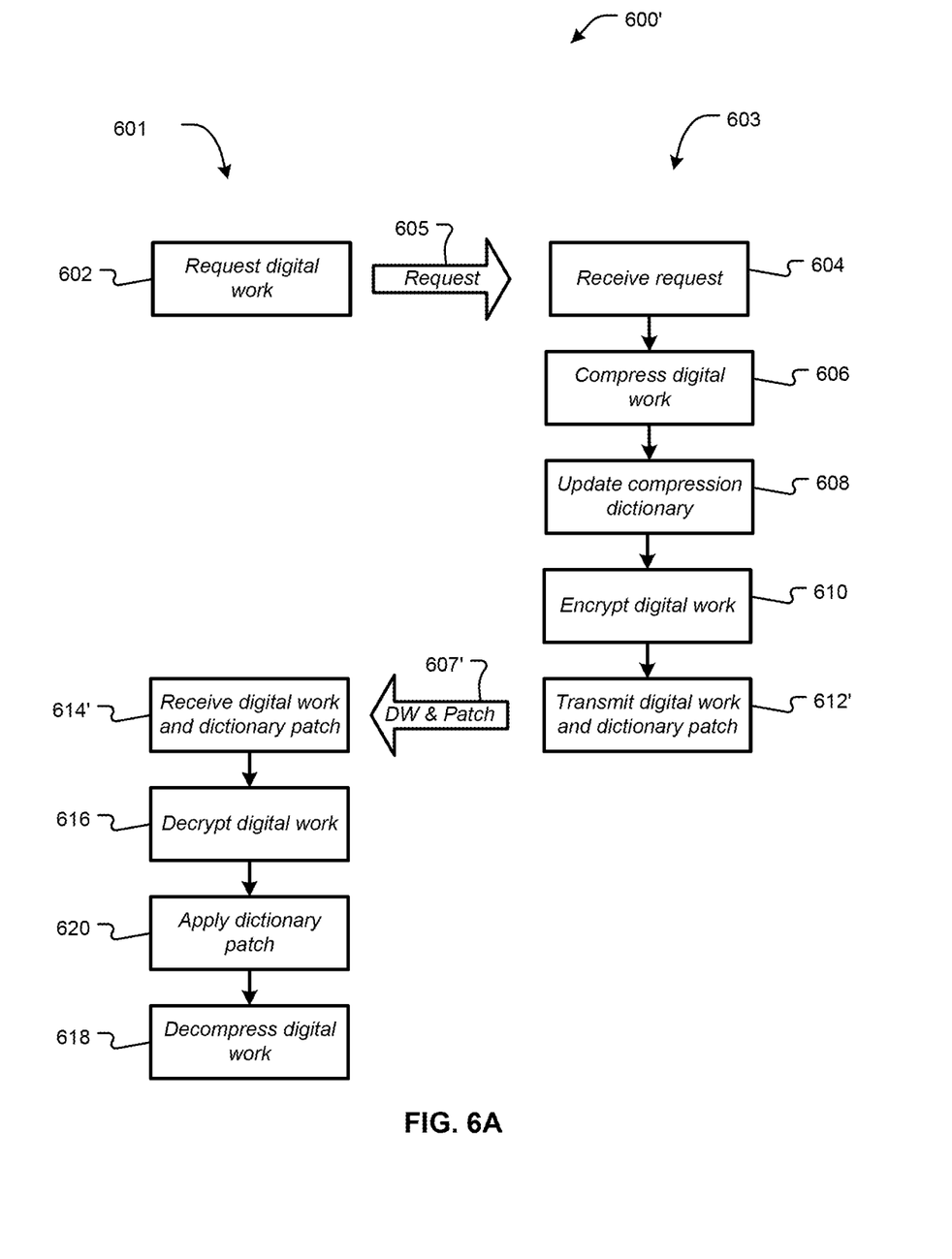
FIG. 6A is a flow chart showing one embodiment of a process flow for distributing a digital work that includes compression utilizing a separate compression dictionary and where the user device is provided with a dictionary patch.

FIG. 6A is a flow chart showing one embodiment of a process flow 600' for distributing a digital work that includes compression utilizing a separate compression dictionary and where the user device 102 is provided with a dictionary patch. At 612', the remote service 104 may transmit a package 607' comprising the digital work and a dictionary patch. Again, although the package 607' is described as containing both the compression dictionary patch and the digital work, in some embodiments the remote service 104 may transmit the digital work and the compression dictionary separately. The user device 102 may receive the digital work and dictionary patch 607' at 614'. Optionally, the user device 102 may, at 620, apply the dictionary patch prior to decompressing the digital work at 618 to generate a complete compression dictionary. Applying the patch may comprise, for example, adding new entries defined by the patch to the previous version of the compression dictionary stored at the user device 102. In some embodiments, the user device 102 does not create a single consolidated compression dictionary, but may instead utilize both the previous version of the compression dictionary and the compression dictionary patch to decompress the digital work.

The remote service may be configured to provide a complete compression dictionary, as shown in FIG. 6, or a compression dictionary patch, as shown in FIG. 6A, according to any suitable design or implementation conditions. For example, in embodiments where the remote service 104 generated a new compression dictionary for the requested digital work, the complete compression dictionary may be sent to the user device 102, as shown in FIG. 6. The complete dictionary may be sent in other situations as well, for example, to minimize the risk of data corruption at the user device 102, etc. In embodiments where the remote service 104 supplemented a previously existing compression dictionary, it may only be necessary for the remote service 104 to provide a compression dictionary patch, as shown in FIG. 6A. Additionally, in cases where the remote service 104 does not make any changes to the previous version of the compression dictionary, it may not be necessary for the remote service 104 to provide the user device 102 with any compression dictionary or update. Instead, the remote service 104 may provide the digital work alone. The user 102 may decompress the digital work by applying a previously stored version of the compression dictionary.

In some embodiments, the user device 102 stores the compression dictionary and/or compression dictionary patches locally at the protected memory space 221. Accordingly, the compression dictionary may be accessible through the operating system 222 or other secure component of the user device 102. For example, when the acquisition application 248 and/or media application 240 requires the compression dictionary to perform decompression, it may access the compression dictionary by directing a request (e.g., an application program interface or API request) to the operating system 222. The operating system 222 may return the compression dictionary. In this way, it may be difficult for unauthorized applications to access the compression dictionary to surreptitiously decompress digital works.

Although various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those of ordinary skill in the art and, consequently, are not described in detail herein.

The flowcharts and methods described herein show the functionality and operation of various implementations. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processing component in a computer system. If embodied in hardware, each block may represent a circuit or a number of interconnected circuits to implement the specified logical function(s).

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

Also, any logic or application described herein that comprises software or code can be embodied in any non-transitory computer readable medium for use by or in connection with an instruction execution system such as a processing component in a computer system. In this sense, the logic may comprise, for example, statements including instructions and declarations that can be fetched from the computer readable medium and executed by the instruction execution system. In the context of the present disclosure, a "computer readable medium" can be any medium that can contain, store, or maintain the logic or application described herein for use by or in connection with the instruction execution system. The computer readable medium can comprise any one of many physical media such as magnetic, optical, or semiconductor media. More specific examples of a suitable computer readable media include, but are not limited to, magnetic tapes, magnetic floppy diskettes, magnetic hard drives, memory cards, solid-state drives, USB flash drives, or optical discs. Also, the computer readable medium may be a random access memory (RAM) including, for example, static random access memory (SRAM) and dynamic random access memory (DRAM), or magnetic random access memory (MRAM). In addition, the computer readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

What is claimed is:

1. A computer-implemented method for processing a digital work, the method comprising:
   receiving, by a server and from a user device, a request for the digital work, wherein the server comprises at least one processor and an operatively associated non-transitory computer readable medium; and
   compressing the digital work, by the server, to generate a compressed digital work, wherein compressing the digital work comprises:
      selecting a first reference string from the digital work, wherein the first reference string has a first string value and a first string location;
      creating a temporary dictionary stored in the non-transitory computer readable medium;
      storing the first string value and the first string location in the temporary dictionary;
      locating in the digital work a second string having a second string value and a second string location different than the first string location;
      identifying using the temporary dictionary that the second string value is equivalent to the first string value;
      replacing the second string value of the second string at the second string location in the digital work with a pointer to the first string location;
      determining a fraction of the compressed digital work that includes a threshold percentage of reference strings of the compressed digital work;
      encrypting the fraction of the compressed digital work to produce an encrypted fraction; and
      transmitting the encrypted fraction and an unencrypted remainder of the compressed digital work to a user device.

2. A computer-implemented system for processing a digital work, the system comprising:
   at least one hardware processor; and
   a non-transitory computer readable medium associated with the at least one hardware processor, wherein the non-transitory computer readable medium comprises thereon instructions that, when executed by the at least one hardware processor, cause the at least one hardware processor to:
      compress the digital work to generate a compressed digital work, wherein to generate the compressed digital work, the at least one hardware processor is configured to:
         select a first reference string from the digital work, wherein the first reference string has a string value and a string location;
         locate in the digital work a second string that has a string value equivalent to the string value of the first reference string and a string location different than the string location of the first reference string;
         replace the string value of the second string with a pointer to the string location of the first reference string;
      encrypt a first portion of the compressed digital work, wherein encrypting the first portion of the compressed digital work comprises encrypting a predetermined fraction of at least one of: the compressed digital work or the reference strings in the digital work; and
      transmit the encrypted first portion of the compressed digital work and a second portion of the compressed digital work to a user device, wherein the second portion of the compressed digital work is unencrypted.

3. The system of claim 2, wherein to generate the compressed digital work, the at least one hardware processor is further configured to:
   write to an in-memory dictionary stored on the non-transitory computer readable medium an indication of the string value of the first reference string and the string location of the first reference string; and
   upon locating the second string in the digital work, reading the string location of the first reference string from the in-memory dictionary.

4. The system of claim 3, wherein to generate the compressed digital work, the at least one hardware processor is further configured to, after the compressed digital work is generated, delete the in-memory dictionary.

5. The system of claim 2, wherein to generate the compressed digital work, the at least one hardware processor is further configured to traverse the digital work from a beginning of the digital work to an end of the digital work, and wherein the first reference string is a first occurrence of a string having the string value of the first reference string.

6. The system of claim 5, wherein traversing the digital work comprises, upon identifying a punctuation character that is followed by a space, determining that the next character is a beginning of a new string.

7. The system of claim 2, wherein to generate the compressed digital work, the at least one hardware processor is further configured to:
   select a second reference string from the digital work, wherein the second reference string has a string value and a string location different than the string value and the string location of the first reference string;
   locate in the digital work a third string that has a string value equivalent to the string value of the second reference string and a string location different than the string location of the second reference string; and
   replace the string value of the third string with a pointer to the string location of the second reference string.

8. The system of claim 2, wherein encrypting the first portion of the compressed digital work comprises encrypting a predetermined fraction of the compressed digital work starting from a beginning of the digital work.

9. The system of claim 2, wherein encrypting the first portion of the compressed digital work comprises encrypting a third portion of the compressed digital work comprising a third predetermined fraction of reference strings in the digital work.

10. The system of claim 2, wherein encrypting the first portion of the compressed digital work comprises encrypting the predetermined fraction of the compressed digital work.

11. A computer-implemented method for processing a digital work, the method comprising:
   selecting a first reference string from the digital work, wherein the first reference string has a string value and a string location;
   locating in the digital work a second string that has a string value equivalent to the string value of the first reference string and a string location different than the string location of the first reference string;
   replacing the string value of the second string with a pointer to the string location of the first reference string;
   encrypting a first portion of the compressed digital work, wherein encrypting the first portion of the compressed digital work comprises encrypting a predetermined fraction of at least one of: the compressed digital work or the reference strings in the digital work; and
   transmitting the encrypted first portion of the compressed digital work and a second portion of the compressed digital work to a user device, wherein the second portion of the compressed digital work is unencrypted.

12. The computer-implemented method of claim 11, further comprising:
   writing to an in-memory dictionary stored on a non-transitory computer readable medium an indication of the string value of the first reference string and the string location of the first reference string; and
   upon locating the second string in the digital work, reading the string location of the first reference string from the in-memory dictionary.

13. The computer-implemented method of claim 12, further comprising, after the compressed digital work is generated, deleting the in-memory dictionary.

14. The computer-implemented method of claim 12, further comprising traversing the digital work from a beginning of the digital work to an end of the digital work, and wherein the first reference string is a first occurrence of a string having the string value of the first reference string.

15. The computer-implemented method of claim 14, further comprising:
   upon identifying a punctuation character that is followed by a space, determining that the next character is a beginning of a new string.

16. The computer-implemented method of claim 11, further comprising:
   selecting a second reference string from the digital work, wherein the second reference string has a string value and a string location different than the string value and the string location of the first reference string;
   locating in the digital work a third string that has a string value equivalent to the string value of the second reference string and a string location different than the string location of the second reference string; and
   replacing the string value of the third string with a pointer to the string location of the second reference string.

17. The computer-implemented method of claim 11, further comprising encrypting the predetermined fraction of the compressed digital work starting from a beginning of the digital work.

18. The computer-implemented method of claim 11, further comprising encrypting a third portion of the compressed digital work that includes the predetermined fraction of reference strings in the digital work.

19. The computer-implemented method of claim 11, wherein encrypting the first portion of the compressed digital work comprises encrypting the predetermined fraction of the compressed digital work.

* * * * *